(12) United States Patent
Yoo et al.

(10) Patent No.: US 11,871,569 B2
(45) Date of Patent: Jan. 9, 2024

(54) NONVOLATILE MEMORY DEVICE HAVING MULTIPLE NUMBERS OF CHANNEL LAYERS

(71) Applicant: SK hynix Inc., Icheon-si (KR)

(72) Inventors: Hyangkeun Yoo, Seongnam-si (KR); Ju Ry Song, Suwon-si (KR); Se Ho Lee, Yongin-si (KR); Jae Gil Lee, Seoul (KR)

(73) Assignee: SK hynix Inc., Icheon-si (KR)

( * ) Notice: Subject to any disclaimer, the term of this patent is extended or adjusted under 35 U.S.C. 154(b) by 48 days.

(21) Appl. No.: 17/484,481

(22) Filed: Sep. 24, 2021

(65) Prior Publication Data

US 2022/0013540 A1    Jan. 13, 2022

Related U.S. Application Data

(62) Division of application No. 16/558,678, filed on Sep. 3, 2019, now Pat. No. 11,164,885.

(30) Foreign Application Priority Data

Dec. 27, 2018    (KR) .................... 10-2018-0171068

(51) Int. Cl.
| | |
|---|---|
| H01L 27/04 | (2006.01) |
| H10B 43/27 | (2023.01) |
| H01L 29/10 | (2006.01) |
| G11C 16/14 | (2006.01) |
| G11C 16/04 | (2006.01) |
| G11C 16/10 | (2006.01) |
| H01L 29/267 | (2006.01) |

(52) U.S. Cl.
CPC ......... *H10B 43/27* (2023.02); *G11C 16/0483* (2013.01); *G11C 16/10* (2013.01); *G11C 16/14* (2013.01); *H01L 29/1037* (2013.01); *H01L 29/267* (2013.01)

(58) Field of Classification Search
CPC .... H10B 43/00; H10B 43/27; H01L 27/11578
See application file for complete search history.

(56) References Cited

U.S. PATENT DOCUMENTS

| | | | |
|---|---|---|---|
| 8,158,880 B1 * | 4/2012 | Girt | B82Y 30/00 257/431 |
| 9,525,065 B1 | 12/2016 | Kyeon | |
| 9,634,097 B2 | 4/2017 | Rabkin et al. | |
| 9,685,454 B2 | 6/2017 | Rabkin et al. | |
| 2011/0188321 A1 | 8/2011 | Kita | |
| 2011/0216604 A1 | 9/2011 | Mikajiri | |
| 2012/0146127 A1 | 6/2012 | Lee | |
| 2012/0235221 A1 | 9/2012 | Ishiduki | |

(Continued)

FOREIGN PATENT DOCUMENTS

| | | | |
|---|---|---|---|
| KR | 20120128438 A | * | 11/2012 |
| KR | 20120128438 A | | 11/2012 |

*Primary Examiner* — Michele Fan

(57) ABSTRACT

A nonvolatile memory device according to an embodiment includes a substrate, a channel structure extending in a direction perpendicular to the substrate; a charge storage structure disposed to be in contact with the channel structure; and a cell electrode structure disposed to be in contact with the charge storage structure in a lateral direction, wherein the channel structure comprises a hole conduction layer and an electron conduction layer.

19 Claims, 8 Drawing Sheets

(56) References Cited

U.S. PATENT DOCUMENTS

| | | |
|---|---|---|
| 2013/0228852 A1 | 9/2013 | Kitazaki |
| 2013/0264626 A1 | 10/2013 | Sawa |
| 2013/0292757 A1 | 11/2013 | Aritome |
| 2014/0056080 A1 | 2/2014 | Lee |
| 2014/0061750 A1 | 3/2014 | Kwon |
| 2015/0076579 A1 | 3/2015 | Tsuji |
| 2015/0221665 A1 | 8/2015 | Yasuda |
| 2015/0371997 A1 | 12/2015 | Higuchi |
| 2016/0005755 A1 | 1/2016 | Yasuda |
| 2016/0104718 A1 | 4/2016 | Omura |
| 2016/0126252 A1 | 5/2016 | Tsu Da |
| 2016/0197090 A1 | 7/2016 | Sasaki |
| 2016/0225783 A1 | 8/2016 | Ishibashi |
| 2016/0276363 A1 | 9/2016 | Fukuzumi |
| 2017/0077115 A1 | 3/2017 | Ino |
| 2018/0025783 A1* | 1/2018 | Choi ................ G11C 16/34 365/185.23 |
| 2020/0098786 A1 | 3/2020 | Park |
| 2020/0119029 A1 | 4/2020 | Leobandung |
| 2020/0185408 A1 | 6/2020 | Song |

\* cited by examiner

NONVOLATILE MEMORY DEVICE HAVING MULTIPLE NUMBERS OF CHANNEL LAYERS

CROSS-REFERENCE TO RELATED APPLICATION

The present application is a divisional application of a U.S. patent application Ser. No. 16/558,678, filed on Sep. 3, 2019, which claims priority under 35 U.S.C 119(a) to Korean Patent Application No. 10-2018-0171068, filed on Dec. 27, 2018, which is herein incorporated by reference in its entirety.

BACKGROUND

1. Technical Field

Various embodiments of the present disclosure generally relate to memory devices and, more particularly, to nonvolatile memory devices having multiple numbers of channel layers.

2. Related Art

As design rule dimensions decrease and the degree of integration increases, research on the structure of memory devices that can guarantee both structural stability and reliability of storage operation has been continued. Recently, as a result of the research, a nonvolatile memory device having a storage cell structure of a three-dimensional structure has been proposed. As an example of the nonvolatile memory device having a three-dimensional storage cell structure, a nonvolatile memory device having a channel layer extending in a direction perpendicular to a substrate and a plurality of memory cells stacked to be in contact with the channel layer in a lateral direction has been proposed.

SUMMARY

Embodiments of the present disclosure provide nonvolatile memory devices that can guarantee the structural stability and operational reliability.

A nonvolatile memory device according to an aspect of the present disclosure includes a substrate, a cell electrode structure disposed on the substrate and including interlayer insulating layers and gate electrode layers that are alternately stacked, a trench penetrating the cell electrode structure on the substrate, a charge storage structure disposed on a sidewall surface of the trench, and a channel structure disposed adjacent to the charge storage structure and extending in a direction parallel to the sidewall surface. The channel structure includes a separate hole conduction layer and an adjacent and separate electron conduction layer. The charge storage structure comprises a charge barrier layer, a charge trap layer and a charge tunneling layer that are sequentially disposed on the sidewall surface and extend parallel to the sidewall surface. The hole conduction layer is disposed on the charge storage structure and the electron conduction layer is disposed on the hole conduction layer. A hole mobility of the hole conduction layer is greater than a hole mobility of the electron conduction layer, and an electron mobility of the electron conduction layer is greater than an electron mobility of the hole conduction layer. The hole conduction layer comprises a semiconductor material selected from at least one of silicon (Si), germanium (Ge), silicon germanium (SiGe), gallium arsenic (GaAs) and indium gallium arsenic (InGaAs). The electron conduction layer comprises indium-gallium-zinc (In—Ga—Zn) oxide. A control electrode structure disposed over or below the cell electrode structure within a control portion of the trench and including an interlayer dielectric layer and a control electrode layer, a control dielectric layer disposed to be in contact with the control electrode structure on a sidewall surface of the control portion of the trench, and a control channel layer disposed adjacent to the control dielectric layer and electrically connected to the channel structure. The control channel layer is a portion of the electron conduction layer configured to extend along the control dielectric layer on the sidewall of the control portion of the trench. The hole conduction layer is configured for a memory erase operation and disposed on the charge storage structure but not on an adjacent control structure, and the electron conduction layer is configured for a memory program operation, and disposed on the hole conduction layer, and disposed on a control dielectric layer of the adjacent control structure, and disposed there between.

A nonvolatile memory device according to another aspect of the present disclosure includes a substrate, a channel structure extending in a direction perpendicular to the substrate, a charge storage structure disposed to be in contact with the channel structure, and a cell electrode structure disposed to be in contact with the charge storage structure in a lateral direction. The channel structure includes a separate hole conduction layer and an adjacent and separate electron conduction layer. The hole conduction layer and the electron conduction layer are disposed to be in contact with each other along a direction perpendicular to the substrate. The charge storage layer includes a charge tunneling layer in contact with the channel structure, a charge trap layer in contact with the charge tunneling layer, and a charge barrier layer in contact with the charge trap layer. The cell electrode structure comprises a gate electrode layer disposed adjacent to the charge barrier layer in a lateral direction. A hole mobility of the hole conduction layer is greater than a hole mobility of the electron conduction layer, and an electron mobility of the electron conduction layer is greater than an electron mobility of the hole conduction layer. The electron conduction layer comprises indium-gallium-zinc (In—Ga—Zn) oxide. The hole conduction layer includes a semiconductor material including a hole as a charge carrier. The semiconductor material includes at least one of silicon (Si), germanium (Ge), silicon germanium (SiGe), gallium arsenic (GaAs) and indium gallium arsenic (InGaAs).

A nonvolatile memory device according to another aspect of the present disclosure includes a cell electrode structure disposed on a substrate and including insulating interlayers and gate electrode layers that are alternately stacked, a trench penetrating the cell electrode structure perpendicular to the substrate, the trench having a sidewall surface, a charge storage structure disposed concentrically with and parallel to the sidewall surface of the trench, a channel structure disposed adjacent to the charge storage structure, and comprising a separate hole conduction layer and an adjacent and separate electron conduction layer, and a control channel structure disposed over or below the cell electrode structure within a control portion of the trench and including a interlayer insulating layer and a control channel layer extending along the sidewall of the control portion of the trench. The control channel layer is a portion of the electron conduction layer and is configured to electrically connect to the channel structure, and to the charge storage structure. The control dielectric layer and the charge barrier layer are discrete but contiguous from the control channel structure to the charge storage structure. The control channel includes an indium gallium arsenic (InGaAs) layer underneath an indium-gallium-zinc-oxide (IGZO) layer configured to decrease a leakage current through the cell electrode structure with reference to a leakage current through a doped polysilicon cell electrode. A thickness of the control channel structure is equal to or less than a thickness of a doped polysilicon control channel structure.

DETAILED DESCRIPTION

Figure 1:
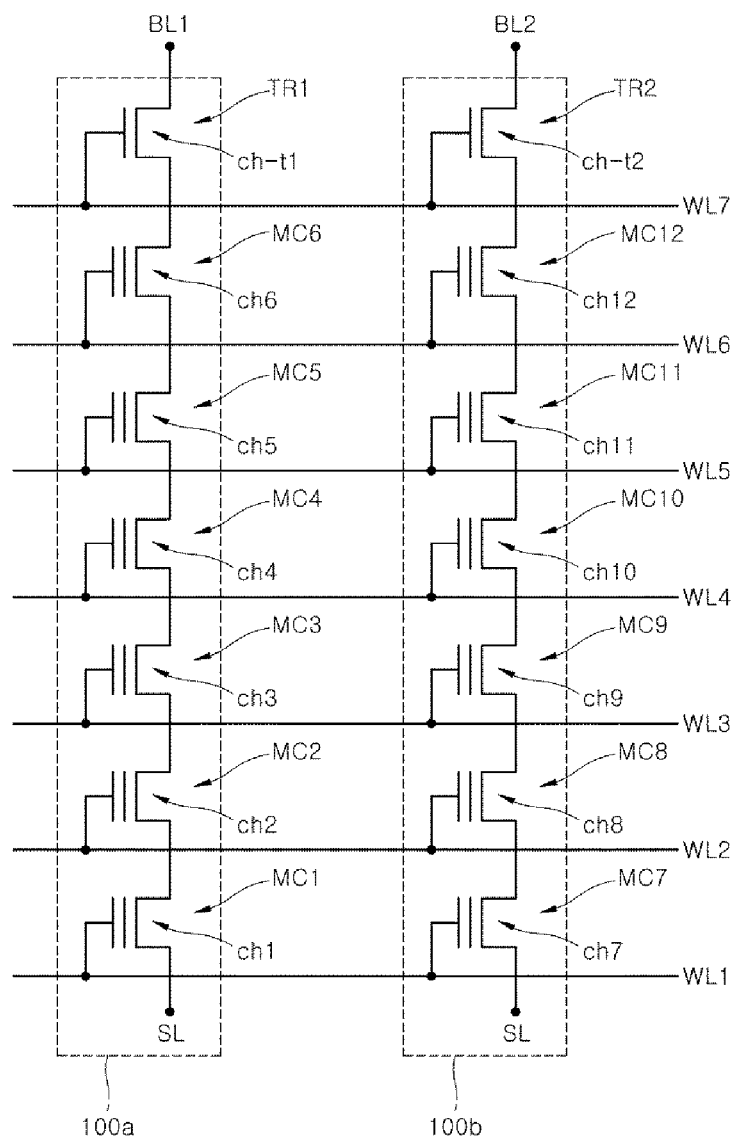
FIG. 1 is a circuit diagram schematically illustrating a nonvolatile memory device according to an embodiment of the present disclosure.

Various embodiments will now be described hereinafter with reference to the accompanying drawings. In the drawings, the dimensions of layers and regions may be exaggerated for clarity of illustration. The drawings are described with respect to an observer's viewpoint. If an element is referred to be located on another element, it may be understood that the element is directly located on the other element, or an additional element may be interposed between the element and the other element. The same reference numerals refer to the same elements throughout the specification.

In addition, expression of a singular form of a word should be understood to include the plural forms of the word unless clearly used otherwise in the context. It will be understood that the terms "comprise" or "have" are intended to specify the presence of a feature, a number, a step, an operation, an element, a part, or combinations thereof, but not used to preclude the presence or possibility of addition one or more other features, numbers, steps, operations, components, parts, or combinations thereof.

An embodiment of the present disclosure provides a nonvolatile memory device having a memory cell transistor and a control transistor. FIG. 1 is a circuit diagram schematically illustrating a nonvolatile memory device according to an embodiment of the present disclosure. Referring to FIG. 1, the nonvolatile memory device 1 may include a cell array having a plurality of strings 100a and 100b. One end of each of the strings 100a and 100b may be connected to a common source line SL, and another end of each of the strings 100a and 100b may be connected to different bit lines BL1 and BL2. In one embodiment, the cell array may constitute NAND type flash memory cells. Although, in exemplary FIG. 1, only a first string 100a and a second string 100b are illustrated for the convenience of explanation, it is not necessarily limited thereto. The number of strings constituting the cell array is not limited.

The first string 100a may have first to sixth memory cell transistors MC1, MC2, MC3, MC4, MC5 and MC6 and a first control transistor TR1 connected in series. The first control transistor TR1 may be disposed between the sixth cell transistor MC6 and a first bit line BL1. The second string 100b may have seventh to twelfth memory cell transistors MC7, MC8, MC9, MC10, MC11 and MC12 and a second control transistor TR2 connected in series. The second control transistor TR2 may be disposed between the twelfth cell transistor MC12 and a second bit line BL2.

The first to twelfth memory cell transistors MC1, MC2, MC3, MC4, MC5, MC6, MC7, MC8, MC9, MC10, MC11 and MC12 may each have a charge storage structure as a gate dielectric layer structure. The charge storage structure may include a charge trap layer for trapped electrons. Depending on whether the charge trap layer is filled with electrons or emptied, different signal information can be stored. A first signal information, includes electrons stored in the charge trap layer, which increase a threshold voltage of the memory cell transistor during the read operation, and enables the first signal information to be identified. The second signal information, includes electrons emptied from the charge trap layer, which decrease the threshold voltage of the memory cell transistor during the read operation, enabling the second signal information to be identified.

The first and second control transistors TR1 and TR2 perform a switching function to switch on/off a channel current between the first and second bit lines BL1 and BL2 and the common source line SL, and a control function to control the magnitude of the channel current conduction through channel layers ch-t1 and ch-t2. The controlled channel current may be provided to the first to the twelfth channel layers ch1, ch2, ch3, ... , ch10, ch11 and ch12 of the first to twelfth memory cell transistors MC1, MC2, MC3, ... , MC10, MC11 and MC12. During the passing of the controlled channel current through the first to twelfth channel layers ch1, ch2, ch3, ... , ch10, ch11 and ch12, charges in the channel participate in the program or erase operation of the corresponding first to twelfth memory cell transistors MC1, MC2, MC3, ... , MC10, MC11 and MC12.

Although, in FIG. 1, each of the first and second strings 100a and 100b is illustrated to have six memory cell transistors for the convenience of explanation, it is not necessarily limited thereto. The number of the memory cell transistors constituting each of the first and second strings 100a and 100b is not limited. In addition, in some other embodiments, the first control transistor TR1 may be disposed between the source line SL and the first memory cell transistor MC1 (not illustrated). Further, the second control transistor TR2 may be disposed between the source line SL and the seventh memory cell transistor MC7 (not illustrated).

In an embodiment of the disclosure, the first to sixth memory cell transistors MC1, MC2, MC3, MC4, MC5 and MC6 in the first string 100a may each be connected to different first to sixth word lines WL1, WL2, WL3, WL4, WL5 and WL6, respectively. The first control transistor TR1 may be connected to the seventh word line WL7. Likewise, the seventh to twelfth memory cell transistors MC7, MC8, MC9, MC10, MC11 and MC12 in the second string 100b may each be connected to different first to sixth word lines WL1, WL2, WL3, WL4, WL5 and WL6, respectively. The second control transistor TR2 may be connected to the seventh word line WL7.

The first to sixth word lines WL1, WL2, WL3, WL4, WL5 and WL6 may provide a program voltage or an erase voltage to a memory gate electrode layer of the first to twelfth memory cell transistors MC1, MC2, MC3, . . . , MC10, MC11 and MC12. In an embodiment, the program voltage may be a voltage that induces electrons to tunnel from the channel layers ch1, ch2, ch3, . . . , ch10, ch11 and ch12 into the charge trap layer. The electrons which have tunneled into the charge trap layer may be stored non-volatilely in the charge trap layer. The erase voltage may, for example, allow holes to tunnel from the channel layers ch1, ch2, ch3, . . . , ch10, ch11 and ch12 into the charge trap layer to be recombined with the electrons stored in the charge trap layer. By the recombination of the electrons and holes, the electrons stored in the charge trap layer are effectively removed.

The seventh word line WL7 may provide a control voltage applied to control gate layers of the first and second control transistors TR1 and TR2. The magnitude of the current passing through the first control channel layer ch-t1 or the second control channel layer ch-t2 is adjusted by changing the control voltage, to a state in which a predetermined voltage is applied between the source line SL and the first bit line BL1 or between the source line SL and the second bit line BL2. As an example, as the magnitude of the control voltage is increased, the current passing through the first control channel layer ch-t1 or the second control channel layer ch-t2 is increased to a predetermined saturation current which is generated in the first and second control transistors TR1 and TR2.

In an embodiment, a predetermined control voltage is applied to the control gate electrode layer, and a predetermined operation voltage is applied between the first bit line BL1 and the common source line SL. A channel current, having a predetermined magnitude, flows through the first to sixth channel layers ch1, ch2, ch3, ch4, ch5 and ch6 and the first control channel layer ch-t1. At this time, a program voltage is applied to a gate electrode layer of at least one memory cell transistor selected from the first to sixth memory cell transistors MC1, MC2, MC3, MC4, MC5 and MC6, to enable electrons to tunnel from the channel layer of the selected at least one memory cell transistor into the charge trap layer. The tunneled electrons are stored in the charge trap layer, so that a program operation for the selected memory cell transistor can be performed.

In the same way, in another embodiment, a predetermined control voltage is applied to the control gate electrode layer, and a predetermined operation voltage is applied between the second bit line BL2 and the common source line SL. A channel current, having a predetermined magnitude, flows through the seventh to twelfth channel layers ch7, ch8, ch9, ch10, ch11 and ch12 and the second control channel layer ch-t2. At this time, a program voltage is applied to a gate electrode layer of at least one memory cell transistor selected from the seventh to twelfth memory cell transistors MC7, MC8, MC9, MC10, MC11 and MC12, to enable electrons to tunnel from the channel layer of the selected at least one memory cell transistor into the charge trap layer, so that a program operation for the selected memory cell transistor can be performed.

An erase operation is performed by applying an erase voltage to a gate electrode layer of at least one memory cell transistor selected from the first to sixth memory cell transistors MC1, MC2, MC3, MC4, MC5 and MC6 or from the seventh to twelfth memory cell transistors MC7, MC8, MC9, MC10, MC11 and MC12. A predetermined operation voltage is applied between the first bit line BL1 and the common source line SL or between the second bit line BL2 and the common source line SL. The holes which have tunneled from the channel layer corresponding to the selected at least one memory cell transistor to the charge trap layer are recombined with the electrons stored in the charge trap layer, so that the electrons are effectively removed. The erase operation for the selected memory cell transistor is thus effectively performed.

Figure 2:
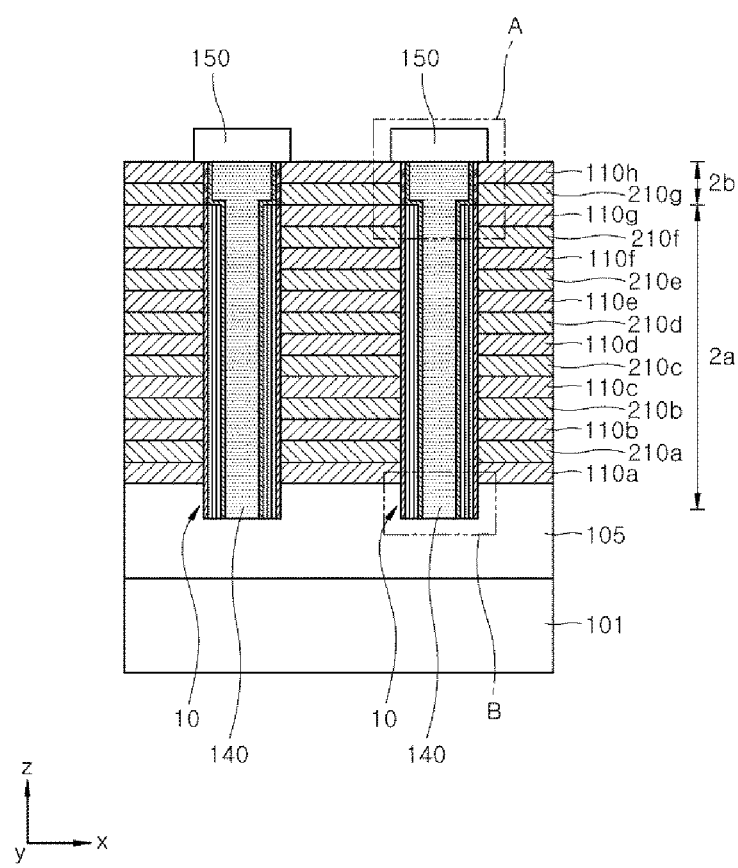
FIG. 2 is a cross-sectional view schematically illustrating a nonvolatile memory device according to an embodiment of the present disclosure.

FIG. 2 is a cross-sectional view schematically illustrating a nonvolatile memory device according to an embodiment of the present disclosure. The illustration includes trenches 10, the substrate 101, a base conduction layer 105, channel core 140, bit lines 150, the cell electrode structure 2a, and the control electrode structure 2b. The cell electrode structure 2a includes the first to seventh insulating layers 110a, 110b, 110c, 110d, 110e, 110f and 110g and the first to sixth gate electrode layers 210a, 210b, 210c, 210d, 210e and 210f, which are alternately stacked as depicted. The control electrode structure 2b includes the insulating layer 110h and the gate electrode layer 210g as depicted.

Figure 3:
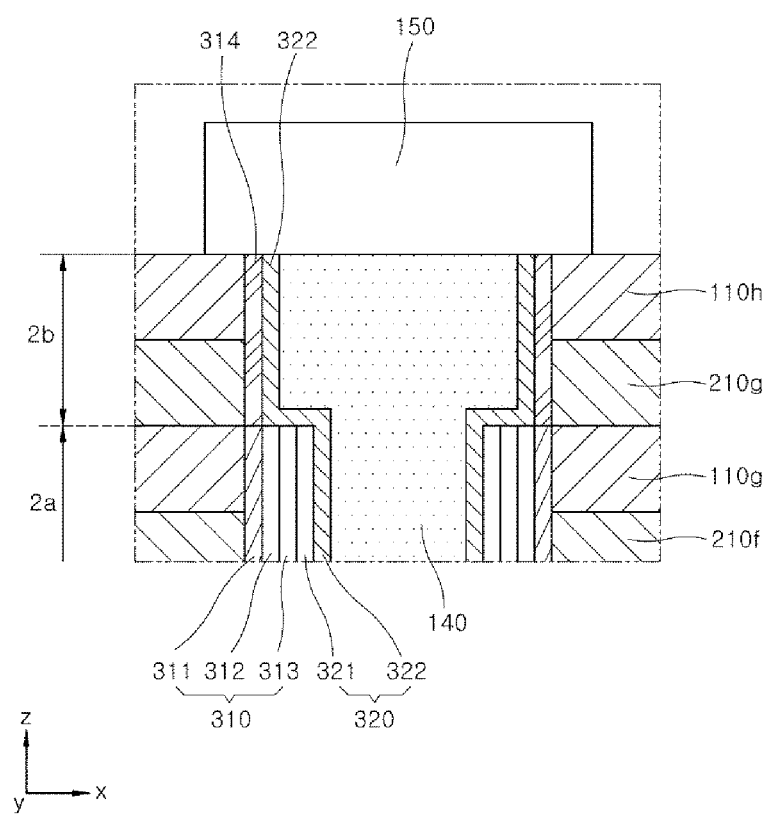
FIG. 3 is an enlarged view of the portion A of the nonvolatile memory device of FIG. 2.

FIG. 3 is an enlarged view of a portion A of the nonvolatile memory device of FIG. 2. The nonvolatile memory device 2 according to the embodiment of the present disclosure may include multiple memory cell transistors connected to each other in a direction perpendicular to a substrate. The illustration includes features and reference numbers same or similar to those of FIG. 2 and further includes the charge storage structure 310, the control dielectric layer 314, the channel structure 320, and the electron conduction layer 322. The charge storage structure 310 includes the charge barrier layer 311, the charge trap layer 312, and the charge tunneling layer 313. The channel structure 320 includes the hole conduction layer 321, and the electron conduction layer 322.

Figure 4:
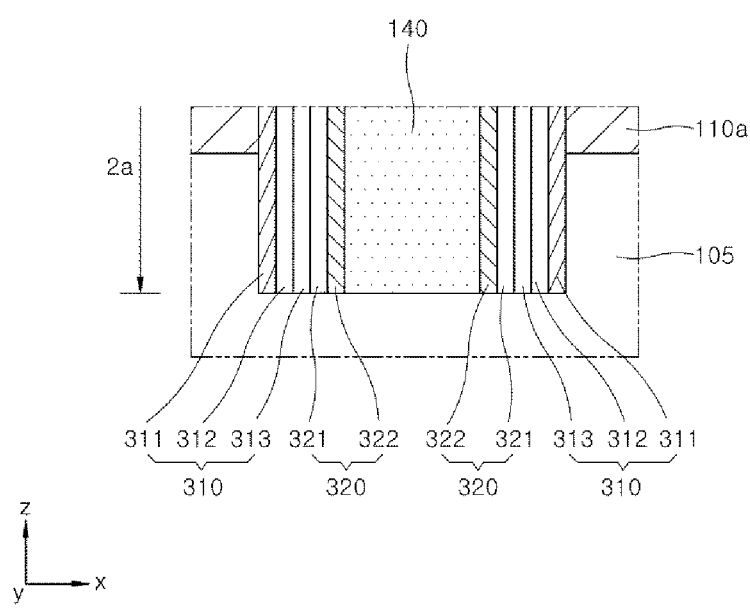
FIG. 4 is an enlarged view of the portion B of the nonvolatile memory device of FIG. 2.

FIG. 4 is an enlarged view of a portion B of the nonvolatile memory device of FIG. 2. The nonvolatile memory device 2 illustrated in FIGS. 2 to 4 may correspond to the nonvolatile memory device 1 implemented in the circuit diagram of FIG. 1. In FIGS. 2 to 4, memory cell transistors of the nonvolatile memory device 2 may correspond to regions including gate electrode layers 210a, 210b, 210c, 210d, 210e and 210f, and a charge storage structure 310 and a channel structure 320 covered by the gate electrode layers 210a, 210b, 210c, 210d, 210e and 210f, respectively. Likewise, the control gate of the nonvolatile memory device 2 may correspond to regions including a control gate electrode layer 210g, a control dielectric layer 314, and an electron conduction layer 322 covered by the control electrode layer 210g.

Referring again to FIGS. 2 to 4, an embodiment of the nonvolatile memory device 2 may include a substrate 101, a base conduction layer 105 disposed on the substrate 101, and a cell electrode structure 2a disposed on the base conduction layer 105. In addition, the nonvolatile memory device 2 may include a control electrode structure 2b disposed on the cell electrode structure 2a. Further, the nonvolatile memory device 2 may include trenches 10 penetrating the cell electrode structure 2a and the control electrode structure 2b on the substrate 101. A charge storage structure 310, and a channel structure 320 are disposed on a sidewall surface of each of the trenches 10 perpendicular to the substrate 101. Additionally, the control dielectric layer 314 and the electron conduction layer 322, as control channel layers may be disposed along a direction perpendicular to the substrate 101, for example, z-direction. In an embodiment, the electron conduction layer 322 disposed on the control dielectric layer 314 may function as the control channel layer controlled by the control transistor.

In an embodiment, the substrate 101 may be a semiconductor substrate. The semiconductor substrate may, for example, be a silicon (Si) substrate, a gallium arsenic (GaAs) substrate, an indium phosphide (InP) substrate, a germanium (Ge) substrate, or a silicon germanium (SiGe) substrate. The semiconductor substrate may be doped into n-type or p-type to have conductivity. In another embodiment, the substrate 101 may be an insulative substrate like a silicon-on-insulator (SOI) substrate. In another embodiment, the substrate 101 may be a conductive substrate like a metal substrate.

Furthermore, in embodiments of the disclosure, the base conduction layer 105 may, for example, include doped semiconductor, metal, conductive metal nitride or conductive metal silicide. In an example, the base conduction layer 105 may include n-type doped silicon. In another example, the base conduction layer 105 may include tungsten (W), titanium (Ti), copper (Cu), aluminum (Al), tungsten nitride, titanium nitride, tantalum nitride, tungsten silicide, titanium silicide, tantalum silicide or a combination of two or more thereof. In an embodiment, the base conduction layer 105 may be electrically connected to a source line (not illustrated). In another embodiment, the base conduction layer 105 may be a source line.

In some embodiments, though it is not illustrated, the substrate 101 may include a well doped with an n-type dopant or a p-type dopant. Various types of semiconductor integrated circuits may be disposed between the substrate 101 and the base conduction layer 105. As an example, one or more conductive circuit pattern layers and one or more insulating pattern layers for insulating the conductive circuit pattern layers may be disposed between the substrate 101 and the base conduction layer 105.

In other words, the cell electrode structure 2a may be disposed on the base conduction layer 105. The cell electrode structure 2a may include the first to seventh interlayer insulating layers 110a, 110b, 110c, 110d, 110e, 110f and 110g and the first to sixth gate electrode layers 210a, 210b, 210c, 210d, 210e and 210f, which are alternately stacked.

As illustrated, the first interlayer insulating layer 110a may contact the base conduction layer 105. The first to seventh interlayer insulating layers 110a, 110b, 110c, 110d, 110e, 110f and 110g may each, for example, include insulative oxide, insulative nitride, insulative oxynitride or the like. The first to seventh interlayer insulating layers 110a, 110b, 110c, 110d, 110e, 110f and 110g may each, for example, include silicon oxide, silicon nitride, or silicon oxynitride.

Furthermore, the first to sixth gate electrode layers 210a, 210b, 210c, 210d, 210e and 210f may each be electrically connected to a word line (not illustrated) of the nonvolatile memory device 2. The first to sixth gate electrode layers 210a, 210b, 210c, 210d, 210e and 210f may each, for example, include metal, conductive metal nitride, conductive metal silicide, conductive metal oxide, conductive metal carbide or the like. The first to sixth gate electrode layers 210a, 210b, 210c, 210d, 210e and 210f may each, for example, include tungsten (W), titanium (Ti), copper (Cu), ruthenium (Ru), tungsten nitride, titanium nitride, tantalum nitride, ruthenium oxide, tungsten carbide, titanium carbide, tungsten silicide, titanium silicide, tantalum silicide or a combination of two or more thereof.

Although, in FIGS. 2 to 4, the first to seventh interlayer insulating layers 110a, 110b, 110c, 110d, 110e, 110f and 110g and the first to sixth gate electrode layers 210a, 210b, 210c, 210d, 210e and 210f are disclosed for the convenience of explanation, the numbers of the interlayer insulating layer and gate electrode layers are not be limited to any certain number.

Additionally, the control electrode structure 2b may be disposed on the cell electrode structure 2a along the z-direction relative to the substrate. The control electrode structure 2b may include an eighth interlayer insulating layer 110h and a control electrode layer 210g. The configurations of the eighth interlayer insulating layer 110h and the control electrode layer 210g may be substantially the same as the configurations of the first to seventh interlayer insulating layers 110a, 110b, 110c, 110d, 110e, 110f and 110g and the first to sixth gate electrode layers 210a, 210b, 210c, 210d, 210e and 210f.

Referring to FIGS. 2 to 4 again, a charge storage structure 310 is in contact with the cell electrode structure 2a on the sidewall surface of the trench 10. The control dielectric layer 314 is in contact with the control electrode structure 2b on the sidewall surface of the trench 10 as well. In an embodiment, the charge storage structure 310 may constitute first to sixth memory cell transistors with the first to sixth gate electrode layers 210a, 210b, 210c, 210d, 210e and 210f and the channel structure 320. The first to sixth memory cell transistors may correspond to the first to sixth memory cell transistors MC1, MC2, MC3, MC4, MC5 and MC6 of the first string 100a. The seventh to twelfth memory cell transistors may correspond to the seventh to twelfth memory cell transistors MC7, MC8, MC9, MC10, MC11 and MC12 of the second string 110b, as described above with reference to FIG. 1. In an embodiment of the disclosure, the charge storage structure 310 may include a charge barrier layer 311, a charge trap layer 312 and a charge tunneling layer 313 that are sequentially disposed from the sidewall surface of the trench 10.

The charge barrier layer 311 may function to suppress the movement of electrons or holes introduced into the charge trap layer 312 from the channel structure 320 to the gate electrode layers 210a, 210b, 210c, 210d, 210e and 210f. In an embodiment, the charge barrier layer 311 may include oxide. As an example, the charge barrier layer 311 may be a silicon oxide layer.

The charge trap layer 312 may trap electrons introduced from the channel structure 320 in the trap sites of the charge trap layer 312 to store the electrons in a nonvolatile manner during a program operation. In addition, the charge trap layer 312 may function to erase the stored electrons by recombining holes introduced from the channel structure 320 with the electrons stored in the charge trap layer 312 during an erase operation. The charge trap layer 312 may have a band gap energy lower than a band gap energy of the charge barrier layer 311 and lower than a band gap energy of the charge tunneling layer 313. In an embodiment, the charge trap layer 312 may include nitride or oxynitride. As an example, the charge trap layer 312 may be a silicon nitride layer or a silicon oxynitride layer.

Furthermore, the charge tunneling layer 313 may tunnel the electrons or holes of the channel structure 320 to the charge trap layer 312 when a voltage applied to the gate electrode layers 210a, 210b, 210c, 210d, 210e and 210f in the cell electrode structure 2a is a predetermined threshold voltage or higher. When the voltage applied to the gate electrode layers 210a, 210b, 210c, 210d, 210e and 210f is lower than the predetermined threshold voltage, the charge tunneling layer 313 may function as a barrier layer that prevents electrons or holes from moving between the channel structure 320 and the charge trap layer 312. In an embodiment, the charge tunneling layer 313 may include oxide, nitride, or oxynitride. The charge tunneling layer 313 may, for example, be a silicon nitride layer or a silicon oxynitride layer. The charge tunneling layer 313 may be a stack structure of at least one thin film. As an example, the charge tunneling layer 313 may be a silicon oxide layer. As another example, the charge tunneling layer 313 may be a thin film structure in which one or more silicon oxide layer and one or more silicon oxynitride layers are stacked.

In other words, the control dielectric layer 314 may constitute a control transistor with the control electrode layer 210g and an electron conduction layer 322. The control transistor may correspond to the first control transistor TR1 of the first string 100a or the second control transistor TR2 of the second string 100b, described above with reference to FIG. 1. The control dielectric layer 314 may not have the charge trap layer of the memory cell transistor because the control transistor performs the function of determining the magnitude of the current conducting along the electron conduction layer 322. The control dielectric layer 314 may be a dielectric layer having a predetermined dielectric constant. The control dielectric layer 314 may, for example, include oxide, nitride or oxynitride. As a specific example, the control dielectric layer 314 may include silicon oxide, silicon nitride, silicon oxynitride, aluminum oxide, titanium oxide, tantalum oxide, hafnium oxide or a combination of two or more thereof.

Referring to FIGS. 2 to 4 again, the channel structure 320 may be disposed adjacent to the charge storage structure 310 and the electron conduction layer 322 may be disposed adjacent to the control dielectric layer 314 on the sidewall surface of the trench 10. The channel structure 320 may include a hole conduction layer 321 and the electron conduction layer 322. In an embodiment, the hole conduction layer 321 may be disposed in contact with the charge tunneling layer 313 of the charge storage structure 310, and the electron conduction layer 322 may be disposed on the hole conduction layer 321. In some other embodiments not illustrated, the electron conduction layer 322 may be disposed in contact with the charge tunneling layer 313 of the charge storage structure 310, and the hole conduction layer 321 may be disposed on the electron conduction layer 322. As described above, the hole conduction layer 321 and the electron conduction layer 322 may be disposed adjacent to each other and may extend in a lateral direction parallel to the sidewall surface of the trench 10. As an example, the hole conduction layer 321 and the electron conduction layer 322 may be disposed in a direction perpendicular to the substrate 101, and in contact with each other.

Referring again to FIG. 3, the electron conduction layer 322 disposed on the control dielectric layer 314 may be a control transistor portion 2b of the trench 10. The electron conduction layer 322 also extends into a memory cell transistor region 2a of the trench 10. The electron conduction layer 322 electrically connects the hole conduction layer 321 to bit line 150 by making contact with the hole conduction layer 312 in a boundary region of the memory cell transistor and the control transistor. In addition, referring to FIG. 4, the hole conduction layer 321 and the electron conduction layer 322 may be connected to the base conduction layer 105. Since the base conduction layer 105 is the source line or connected to the source line, the hole conduction layer 321 and the electron conduction layer 322 are electrically connected to the source line.

Referring further to FIG. 3, the electron conduction layer 322 enables a memory program operation and is disposed on the hole conduction layer 321 and disposed on the control dielectric layer 314 and is disposed there between. Additionally, the control dielectric layer 314 and the charge barrier layer 311 are discrete but contiguous from the control channel structure to the charge storage structure as depicted by different cross-hatched layers.

In an embodiment, the hole mobility of the hole conduction layer 321 may be greater than the hole mobility of the electron conduction layer 322. In another embodiment, the hole mobility of the hole conduction layer 321 may be greater than the electron mobility of the hole conduction layer 321. In an embodiment, the electron mobility of the electron conduction layer 322 may be greater than the hole mobility of the electron conduction layer 322.

When a predetermined voltage is applied between the bit line 150 and the base conduction layer 105, holes can conduct through the hole conduction layer 321 and electrons can conduct through the electron conduction layer 322 in the memory cell transistor region 2a. On the other hand, electrons and holes can conduct through the electron conduction layer 322 in the control transistor region 2b.

In an embodiment, the hole conduction layer 321 may include a semiconductor material having hole as a charge carrier. The semiconductor material may, for example, include silicon (Si), germanium (Ge), silicon germanium (SiGe), gallium arsenic (GaAs), indium gallium arsenic (InGaAs) or a combination of two or more thereof. In an embodiment, the semiconductor material may not be doped, or may be doped with a p-type dopant.

In an embodiment, the electron conduction layer 322 may include an oxide semiconductor material. As an example, the electron conduction layer 322 may include indium-gallium-zinc (In—Ga—Zn) oxide. The indium-gallium-zinc (In—Ga—Zn) oxide may be crystalline or amorphous. As an example, the indium-gallium-zinc (In—Ga—Zn) oxide may be C-axis aligned crystalline indium-gallium-zin oxide (In—Ga—Zn, CAAC-IGZO). The electron mobility of the electron conduction layer 322 may be greater than the electron mobility of a conventional channel layer formed of doped poly-silicon.

Figure 5:
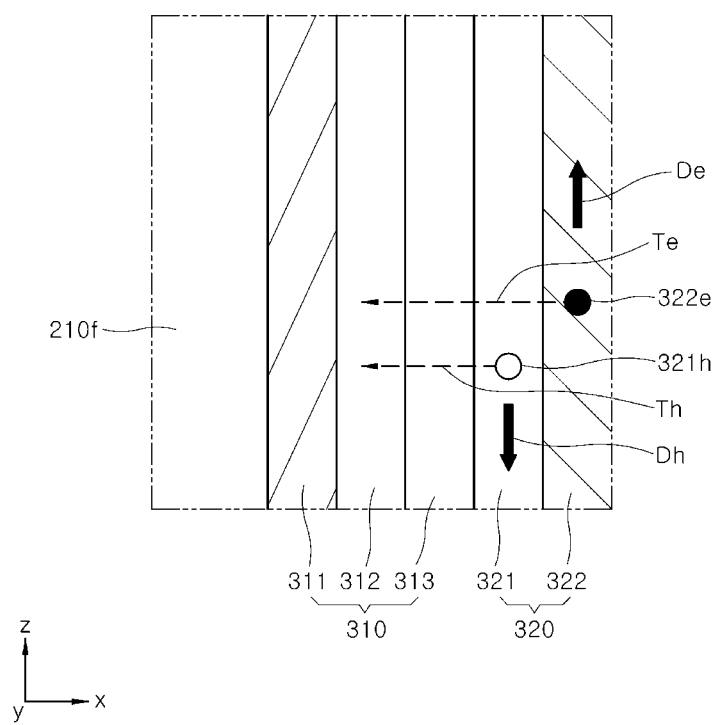
FIG. 5 is a schematic view illustrating program and erase operations of a memory cell transistor according to an embodiment of the present disclosure.

FIG. 5 is a schematic view illustrating program and erase operations of a memory cell transistor according to an embodiment of the present disclosure. FIG. 5 represents the memory cell transistor portion of the nonvolatile memory device described above with reference to FIGS. 1 to 4.

Referring to FIGS. 1 to 5, when a predetermined operation voltage is applied between the bit line 150 and the base conduction layer 105, a channel current is controlled to a predetermined magnitude by the control transistor and the channel structure 320 of the memory cell transistor through the electron conduction layer 322. Therefore, channel current electron and hole components in the channel structure 320 are conducted through different paths as follows.

In an embodiment, the base conduction layer 105 is connected to a ground line and a predetermined positive bias is applied to the bit line 150. Holes 321h may be conducted mainly in a first direction Dh along the hole conduction layer 321, and electrons 322e may be conducted mainly in a second direction De along the electron conduction layer 322. In contrast, the mobility of holes and electrons are increased by the hole conduction layer 321 and the electron conduction layer 322 of this embodiment applied together, rather than holes and electrons conducted together in a single channel layer of doped poly-silicon.

At this time, a program voltage having a positive polarity is applied to at least one of the gate electrode layers 210a, 210b, 210c, 210d, 210e and 210f, to enable electrons 322e in the electron conduction layer 322 to pass through the hole conduction layer 321 and the charge tunneling layer 313 and move in the lateral direction Te, thereby entering the charge trap layer 312. The electrons entering and trapped in trap sites of the charge trap layer 312 are stored as signal information. Likewise, when a program voltage having a negative polarity is applied to at least one of the gate electrode layers 210a, 210b, 210c, 210d, 210e and 210f, holes 321h in the hole conduction layer 321 pass through the charge tunneling layer 313 and move in the lateral direction Th, thereby entering the charge trap layer 312. The holes 321h entering the charge trap layer 312 are recombined with the electrons trapped at the trap sites of the charge trap layer 312, so that the electrons are effectively erased from the charge trap layer 312.

Consequently, in an embodiment of the present disclosure, the channel structure 320, including the hole conduction layer 321 and the electron conduction layer 322 may be used to improve the mobility of holes and electrons conducted through the channel structure 320. Accordingly, a gate voltage is applied to a predetermined gate electrode layer enables the rate at which charges are introduced into the charge trap layer 312 from the channel structure 320 to be increased.

Referring to FIGS. 1 and 2, increasing the memory capacity by increasing the number of memory cells connected to one string, the length of a channel layer extending in a direction perpendicular to the substrate 101 can be increased. Accordingly, during conventional program and erase operations, the channel layers of multiple memory cell transistors may not be supplied with a channel current of a sufficient magnitude for tunneling to a charge trap layer. According to embodiments of the present disclosure, in the channel structure, the channel layer in which holes and electrons are conducted are separated into a hole conduction layer and an electron conduction layer, respectively. In addition, in the case of the hole conduction layer, it can be configured to include a material capable of improving hole mobility, and in the case of the electron conduction layer, it can be configured to include a material capable of improving electron mobility. Consequently, as described above, when the cell integration of the nonvolatile memory device increases, the channel current supplied to a plurality of memory cell transistors can also be increased and at least be prevented from decreasing.

In the embodiment of the present disclosure, a metal oxide that has electron mobility greater than that of the conventional doped poly-silicon or doped monocrystalline silicon and has a band gap energy greater than that of the conventional doped poly-silicon or doped monocrystalline silicon can be applied as the electron conduction layer 322 of the channel structure 320. As an example, the metal oxide may include crystalline indium-gallium-zinc (In—Ga—Zn) oxide. With the metal oxide applied to the electron conduction layer 322, the reliability of a program operation can be improved in a region where the channel potential changes between the control transistor and the memory cell transistor. This configuration will be described in more detail below with reference to FIGS. 6, 7A and 7B.

Figure 6:
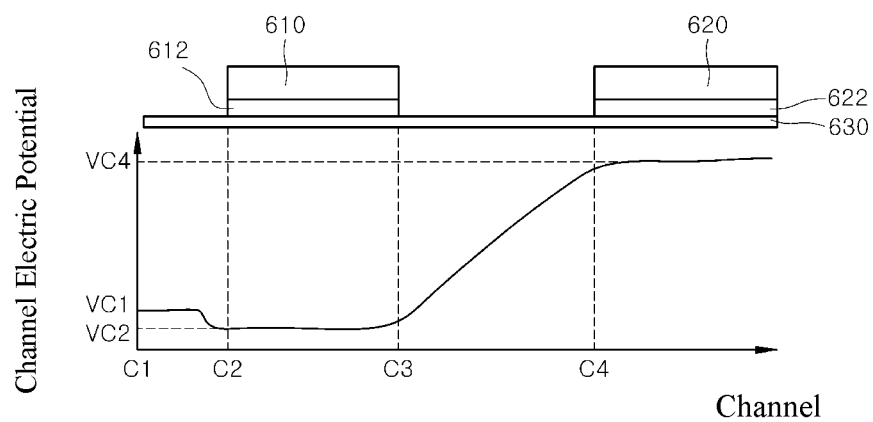
FIG. 6 is a schematic view explaining an electric potential of a channel layer in a nonvolatile memory device according to an embodiment of the present disclosure.

FIG. 6 is a schematic view illustrating an electric potential of a channel layer in a nonvolatile memory device according to an embodiment of the present disclosure. Channel electric potential is indicated by the ordinate and channel regions are indicated by the abscissa.

The nonvolatile memory device illustrated has substantially the same configuration as that of the nonvolatile memory device 2 described above with reference to FIGS. 2 to 4. For convenience of explanation, the electron conduction layer 322 of the control transistor or of the channel structure 320 of the memory cell transistor of FIGS. 2 to 4, is simplified to a channel layer 630. In addition, the control dielectric layer 314 and the charge storage structure 310 of FIGS. 2 to 4 are simplified to a control dielectric layer 612 and a cell dielectric layer 622, respectively. Furthermore, the control electrode layer 210g and the sixth gate electrode layer 210f of FIGS. 2 to 4 are simplified to a control electrode layer 610 and a cell electrode layer 620, respectively.

In the embodiment of FIG. 6, a first channel region between a first channel point C1 and a second channel point C2 corresponds to a region of the electron conduction layer 322 from the bit line 150 to an interface of the eighth interlayer insulating layer 110h and the control electrode layer 210g along the z-direction in FIGS. 2 and 3. In the first channel region, the channel layer 630 may have a first channel electric potential VC1. A second channel region between the second channel point C2 and a third channel point C3, where the channel layer 630 is controlled by the control electrode layer 610, corresponding to the electron conduction layer 322 covered by the control electrode layer 210g along the z-direction, in FIGS. 2 and 3. In the second channel region, the channel layer 630 may have a second channel electric potential VC2 lower than the first channel electric potential VC1.

Moreover, the electric potential of the channel layer 630 may be increased from a third channel transitory electric potential VC3 to a predetermined fourth channel electric potential VC4 across a third channel region. The third channel region from the third channel point C3 covered by the control electrode layer 610 to a fourth channel point C4 ends where the channel layer 630 is covered by the cell electrode layer 620 in which the program and erase operations are performed. The electric potential of the channel layer 630 is increased to the fourth channel electric potential VC4 by controlling the gate voltage applied to the cell electrode layer 620.

Figure 7A:
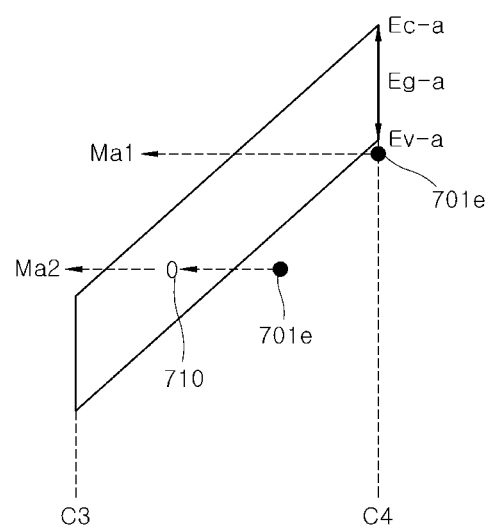
FIG. 7A is an energy band diagram illustrating an energy level of a channel layer in a nonvolatile memory device according to a comparative example of the present disclosure.

FIG. 7A is an energy band diagram illustrating an energy level of a channel layer in a nonvolatile memory device according to a comparative example of the present disclosure. The exemplary energy band diagram illustrates the electron conduction layer between the third channel point C3 and the fourth channel point C4 of FIG. 6 for a conventionally doped poly-silicon or doped monocrystalline silicon channel layer. The energy band diagram of FIG. 7A represents the changes of a conduction band energy Ec-a, a valence band energy Ev-a, and a band gap energy Eg-a of the electron conduction layer according to a gate voltage applied to the cell electrode layer 620.

Figure 7B:
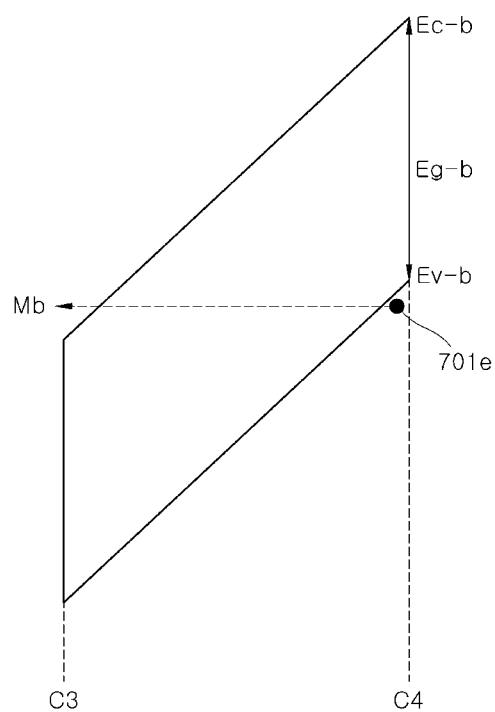
FIG. 7B is an energy band diagram illustrating an energy level of the electron conduction layer in a nonvolatile memory device according to an embodiment of the present disclosure.

FIG. 7B is an energy band diagram illustrating an energy level of the electron conduction layer in a nonvolatile memory device according to the embodiment of the present disclosure. FIG. 7B illustrates an energy band diagram of the electron conduction layer between the third channel point C3 and the fourth channel point C4 in FIG. 6. In the embodiment, a crystalline indium-gallium-zinc (In—Ga—Zn) oxide forms the electron conduction layer in the channel layer 630. The energy band diagram of FIG. 7B represents the changes of a conduction band energy Ec-b, a valence band energy Ev-b and a band gap energy Eg-b of the electron conduction layer according to the gate voltage applied to the cell electrode layer 620.

Referring to FIGS. 7A and 7B, the band gap energy Eg-b of the electron conduction layer of the FIG. 7B embodiment is greater than the band gap energy Eg-a of the electron conduction layer of the FIG. 7A embodiment. As an example, the indium-gallium-zinc (In—Ga—Zn) oxide as an embodiment has a band gap energy of about 3.2 electron volt (eV) to about 3.8 electron volt (eV), while silicon as a comparative example has a band gap energy of about 1.17 electron volt (eV).

A predetermined gate voltage applied to the cell electrode layer 620 changes the channel electric potential at the third channel point C3 and at the fourth channel point C4 and generates a band bending phenomenon of the electron conduction layer, as illustrated in FIGS. 7A and 7B.

In the case of the comparative example in which the band gap energy of the electron conduction layer is relatively low, as a result of the band bending of the electron conduction layer, there may be an increased probability that electrons 701*e* existing in a region of the valence band energy Ev-a directly tunnel to a region of the conduction band energy Ec-a (Ma1) or tunnel to a region of the conduction band energy Ec-a (Ma2) via trap sites 710 in the electron conduction layer. As such, electrons 701*e* tunneling to the conduction band energy Ec-a region are mainly conducted along the electron conduction layer by an electric field applied between the source line and the bit line, thereby lowering the efficiency of the program operation in which electrons are introduced into the charge trap layer. That is, a gate voltage applied to the cell electrode layer 620, conducts electrons 701*e* tunneling by the above-described operation mechanism not along the charge trap layer but along the electron conduction layer, thereby acting as a leakage current.

On the other hand, referring to the FIG. 7B embodiment, the band gap energy of the electron conduction layer is relatively great in the region between the third channel point C3 and the fourth channel point C4, so the probability that electrons 701*e* existing in the region of the valence band energy Ev-b directly tunnel (Mb) to the region of the conduction band energy Ec-b is decreased, and therefore the leakage current created by the tunneling electrons 701*e* described above is suppressed.

As described above, according to embodiments of the present disclosure, the inter-band tunneling phenomenon in which electrons or holes move from the valence band of the electron conduction layer to the conduction band is suppressed by applying a material having a higher band gap energy than the conventional doped poly-silicon or doped monocrystalline silicon to the electron conduction layer. Accordingly, the leakage current generated by a gate voltage applied to the memory cell transistor adjacent to the control transistor is effectively suppressed.

In an embodiment of the disclosure, the control channel further comprises an indium gallium arsenic (InGaAs) layer underneath an indium-gallium-zinc-oxide (IGZO) layer configured to decrease a leakage current through the cell electrode structure without dummy cells with reference to a doped polysilicon cell electrode with dummy cells in the bit line to source strings 100*a* and 100*b* of FIG. 1 (dummy cells not depicted). A dummy cell is used in doped polysilicon cell electrode structures to control leakage current and memory cell array edge processing effects but does not contain information.

Furthermore, in an embodiment of the present disclosure, a thickness of the dual layer control channel structure is equal to or less than a thickness of a doped polysilicon control channel structure in a range of 5 nm to 10 nm. Thus, memory cell density is maintained and even increased in the absence of any dummy cells in the non-volatile memory cell device array.

The embodiments of the inventive concept have been disclosed above for illustrative purposes. Those of ordinary skill in the art will appreciate that various modifications, additions and substitutions are possible, without departing from the scope and spirit of the inventive concept as disclosed in the accompanying claims.

What is claimed is:

1. A nonvolatile memory device comprising:
a substrate;
a channel structure extending in a direction perpendicular to the substrate;
a charge storage structure disposed to be in contact with the channel structure; and
a cell electrode structure disposed to be in contact with the charge storage structure in a lateral direction,
wherein the channel structure comprises a hole conduction layer and an electron conduction layer,
wherein the nonvolatile memory device further comprises:
a control electrode structure disposed over or below the cell electrode structure; and
a control channel layer disposed adjacent to the control electrode structure,
wherein the control channel layer is a portion of the electron conduction layer of the channel structure and excludes the hole conduction layer.

2. The nonvolatile memory device of claim 1,
wherein the hole conduction layer and the electron conduction layer are disposed to be in contact with each other along a direction perpendicular to the substrate.

3. The nonvolatile memory device of claim 1,
wherein the charge storage layer comprises:
a charge tunneling layer in contact with the channel structure;
a charge trap layer in contact with the charge tunneling layer; and
a charge barrier layer in contact with the charge trap layer.

4. The nonvolatile memory device of claim 1,
wherein the cell electrode structure comprises a gate electrode layer disposed adjacent to the charge barrier layer in a lateral direction.

5. The nonvolatile memory device of claim 1, wherein a hole mobility of the hole conduction layer is greater than a hole mobility of the electron conduction layer, and
wherein an electron mobility of the electron conduction layer is greater than an electron mobility of the hole conduction layer.

6. The nonvolatile memory device of claim 1,
wherein the electron conduction layer comprises indium-gallium-zinc (In—Ga—Zn) oxide.

7. The nonvolatile memory device of claim 1,
wherein the hole conduction layer comprises a semiconductor material including a hole as a charge carrier.

8. The nonvolatile memory device of claim 7,
wherein the semiconductor material comprises at least one of silicon (Si), germanium (Ge), silicon germanium (SiGe), gallium arsenic (GaAs) and indium gallium arsenic (InGaAs).

9. The nonvolatile memory device of claim 1,
wherein the hole conduction layer is disposed on the charge storage structure, and
wherein the electron conduction layer is disposed on the hole conduction layer.

10. The nonvolatile memory device of claim 1, further comprising:
a control dielectric layer disposed to be in contact with the control electrode structure,
wherein the control electrode structure includes an interlayer dielectric layer and a control electrode layer, and
wherein the control channel layer is disposed adjacent to the control dielectric layer and electrically connected to the channel structure.

11. The nonvolatile memory device of claim 1,
further comprising a control dielectric layer disposed to be in contact with the control electrode structure,
wherein the control channel layer extends along the control dielectric layer.

12. A nonvolatile memory device comprising:
a substrate;
a channel structure extending in a direction perpendicular to the substrate;
a charge storage structure disposed to be in contact with the channel structure;
a cell electrode structure disposed to be in contact with the charge storage structure in a lateral direction;
a control electrode structure disposed over or below the cell electrode structure on the substrate, the control electrode structure including an interlayer dielectric layer and a control electrode layer;
a control dielectric layer disposed to be in contact with the control electrode structure; and
a control channel layer disposed adjacent to the control dielectric layer and electrically connected to the channel structure,
wherein the channel structure comprises a hole conduction layer and an electron conduction layer,
wherein the control channel layer is a portion of the electron conduction layer configured to extend along the control dielectric layer and the control channel layer excludes the hole conduction layer.

13. The nonvolatile memory device of claim 12,
wherein the hole conduction layer and the electron conduction layer are disposed to be in contact with each other along a direction perpendicular to the substrate.

14. The nonvolatile memory device of claim 12,
wherein the charge storage layer comprises:
a charge tunneling layer in contact with the channel structure;
a charge trap layer in contact with the charge tunneling layer; and
a charge barrier layer in contact with the charge trap layer.

15. The nonvolatile memory device of claim 12,
wherein the cell electrode structure comprises a gate electrode layer disposed adjacent to the charge barrier layer in a lateral direction.

16. The nonvolatile memory device of claim 12, wherein a hole mobility of the hole conduction layer is greater than a hole mobility of the electron conduction layer, and
wherein an electron mobility of the electron conduction layer is greater than an electron mobility of the hole conduction layer.

17. The nonvolatile memory device of claim 12,
wherein the electron conduction layer comprises indium-gallium-zinc (In—Ga—Zn) oxide.

18. The nonvolatile memory device of claim 12,
wherein the hole conduction layer comprises a semiconductor material including a hole as a charge carrier,
wherein the semiconductor material comprises at least one of silicon (Si), germanium (Ge), silicon germanium (SiGe), gallium arsenic (GaAs) and indium gallium arsenic (InGaAs).

19. The nonvolatile memory device of claim 12,
wherein the hole conduction layer is disposed on the charge storage structure, and
wherein the electron conduction layer is disposed on the hole conduction layer.

* * * * *